US 9,755,634 B2

(12) United States Patent
Knoedgen

(10) Patent No.: US 9,755,634 B2
(45) Date of Patent: Sep. 5, 2017

(54) LOW CURRENT START UP INCLUDING POWER SWITCH

(71) Applicant: Dialog Semiconductor GmbH, Kirchheim/Teck-Nabern (DE)

(72) Inventor: Horst Knoedgen, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 1055 days.

(21) Appl. No.: 13/906,622

(22) Filed: May 31, 2013

(65) Prior Publication Data
US 2014/0055174 A1    Feb. 27, 2014

(30) Foreign Application Priority Data

Aug. 24, 2012 (EP) .................................... 12181720

(51) Int. Cl.
*H02M 1/00*    (2006.01)
*H03K 17/16*   (2006.01)
*H02M 1/36*    (2007.01)

(52) U.S. Cl.
CPC ............ *H03K 17/163* (2013.01); *H02M 1/36* (2013.01)

(58) Field of Classification Search
CPC ................................ H02M 3/156; H01M 1/36
USPC ............................ 320/166; 323/234; 363/49
See application file for complete search history.

(56) References Cited

U.S. PATENT DOCUMENTS

| 4,887,199 | A  | * | 12/1989 | Whittle | H02M 1/36 363/21.1 |
| 2005/0212583 | A1 | * | 9/2005 | Pai | H03K 17/687 327/427 |
| 2006/0055446 | A1 | * | 3/2006 | Tai | H02M 3/155 327/430 |
| 2007/0145922 | A1 | * | 6/2007 | Ito | H03K 17/163 318/300 |

(Continued)

FOREIGN PATENT DOCUMENTS

WO    WO 89/03136    4/1989

OTHER PUBLICATIONS

European Search Report 12181720.0-1809 dated Apr. 3, 2013, Dialog Semiconductor GmbH.

(Continued)

*Primary Examiner* — Richard Isla Rodas
*Assistant Examiner* — Johali Torres Ruiz
(74) *Attorney, Agent, or Firm* — Saile Ackerman LLC; Stephen B. Ackerman

(57) ABSTRACT

The present document relates to a start-up circuit comprising a power switch wherein a circuit charges a supply voltage capacitor. The capacitor provides a supply voltage to a power switch; the power switch forms a switched power converter with a power converter network. The circuit comprises a source and gate interface for coupling the circuit to the power switch; a capacitor interface couples the circuit to the supply voltage capacitor; a start-up path couples the gate interface to the capacitor interface; wherein the startup path provides a voltage at the gate interface which is at or above a threshold voltage of the power switch; and a charging path couples the source interface to the capacitor interface; wherein the charging path provides a charging current to the capacitor interface, when the power switch is in on-state.

13 Claims, 7 Drawing Sheets

(56) References Cited

U.S. PATENT DOCUMENTS

Figure 1:
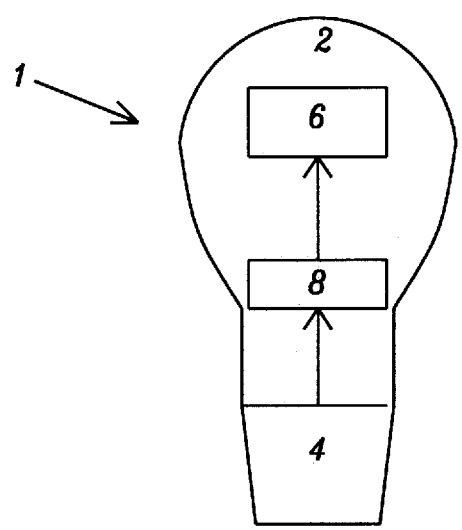

2011/0121313 A1* 5/2011 Briere ................ H01L 29/2003
                                                                    257/76
2011/0148382 A1   6/2011 Tiruvuru

OTHER PUBLICATIONS

Chinese Office Action 518028 and English language letter from Chinese patent firm ZYIP describing content, dated Nov. 4, 2015, Dialog Semiconductor GmbH.
PCT International Application WO 89/03136, dated Apr. 6, 1989, Dialog Semiconductor GmbH.

* cited by examiner

LOW CURRENT START UP INCLUDING POWER SWITCH

TECHNICAL FIELD

The present document relates to the control of power switches. In particular, the present document relates to the start-up of a circuit arrangement which comprises a power switch, such as a switched-mode power supply.

BACKGROUND

Power switches are used e.g. in switched-mode power supplies, e.g. DC-to-DC power converters such as buck converters or SEPIC converters. Such power converters may be used within chargers for electronic devices (e.g. computing devices) which comprise a rechargeable battery and/or within driver circuits for SSL (solid state lighting) devices which comprise e.g. LEDs (light emitting diodes) and/or OLEDs (organic LEDs).

The power converters comprise a power converter network and one or more power switches, wherein the one or more power switches are typically operated in a switched on/off mode, such that energy is converted from an input side of the power converter to an output side of the power converter. The energy is typically provided by a mains power supply. For the operation of the one or more power switches a supply voltage Vcc may be required. The supply voltage Vcc for the one or more power switches may be provided using a supply voltage capacitor.

During start-up of the power converter, the supply voltage capacitor may need to be charged in order to provide the supply voltage Vcc. It is typically desirable to limit the size of the supply voltage capacitor (e.g. for size and cost reasons) and/or to limit the start-up current required to charge the supply voltage capacitor (e.g. for limiting the load to the mains voltage). Typically, the one or more power switches can only start normal operation once the supply voltage capacitor has been sufficiently charged to provide the supply voltage Vcc. This results in relatively long start-up times (e.g. in the range of seconds) for the one or more power switches and for the power converter.

The supply voltage capacitors may be charged using dedicated power transistors which are used upon start-up to couple the supply voltage capacitors to the (rectified) mains voltage. The use of dedicated power transistors for the start-up of a power converter is costly and it is therefore desirable to reduce the number of required power transistors.

The present document addresses the above mentioned technical problems. In particular, the present document describes an electronic circuit which is configured to charge a supply voltage capacitor from a mains supply (and to thereby generate a supply voltage for a power switch). The electronic circuit allows for low start-up time intervals and/or may be used in conjunction with low capacitance supply voltage capacitors. Furthermore, the electronic circuit enables use of the one or more power switches of the power converter for charging the supply voltage capacitor, thereby removing the need for additional dedicated power switches, i.e. thereby reducing the cost of the power converter.

SUMMARY OF THE DISCLOSURE

A principal object of the present disclosure is to achieve an electronic circuit which is configured to charge a supply voltage capacitor from a mains supply and to thereby generate a supply voltage for a power switch)

A further object of the disclosure is to improve the perceptual performance of hands-free applications of mobile electronic communication devices.

A further object of the disclosure is to reduce the number of power transistors required.

A further object of the disclosure is to use one or more power switches of the power converter for charging the supply voltage capacitor.

A further object of the disclosure is to limit the size or capacitance of a supply voltage capacitor.

In accordance with the objects of this disclosure an electronic circuit configured to charge a supply voltage capacitor, wherein the supply voltage capacitor is intended for providing a supply voltage to a gate of a source-controlled power switch; wherein the power switch forms a switched-mode power converter, in conjunction with a power converter network; and wherein the drain of the power switch is coupled to a mains voltage has been achieved. The circuit disclosed comprises a gate interface and a source interface intended for coupling the circuit to the gate and a source of the power switch, respectively, a capacitor interface intended for coupling the circuit to the supply voltage capacitor, a start-up path arranged to couple the gate interface to the capacitor interface; wherein the start-up path is configured to apply a voltage at the gate interface, which is at or above a threshold voltage of the power switch, and a charging path arranged to couple the source interface to the capacitor interface, wherein the charging path is configured to provide a charging current to the capacitor interface, when the power switch is in on-state.

In accordance with the objects of this disclosure a method to achieve an electronic start-up circuit charging a supply voltage capacitor, wherein the supply voltage capacitor is intended for providing a supply voltage to a gate of a source-controlled power switch; wherein the power switch forms a switched-mode power converter, in conjunction with a power converter network; and wherein the drain of the power switch is coupled to a mains voltage has been achieved. The method comprises the steps of providing start-up circuit for a switched-mode power converter circuit wherein the power converter comprises a power switch, having a gate voltage provided by a supply voltage capacitor, operating in conjunction with a power converter network, coupling via a start-up path of the start-up circuit a gate interface of the start-up circuit to a capacitor interface of the start-up circuit, wherein the start-up path applies a voltage at the gate interface which is at or above a threshold voltage of the power switch and wherein a voltage drop at the gate of the power transistor starts-up the power switch, charging the supply voltage capacitor without requiring a dedicated power switch for charging the supply capacitor by a charging path of the start-up circuit coupling a source interface of the start-up circuit to the capacitor interface wherein the charge path provides a charging current to the capacitor interface during a pre-determined start-up time interval when the power switch is in; wherein the charging path is configured to provide a charging current to the capacitor interface, when the power switch is in on-state, and deactivating the start-up circuit including start-up path and charging path subsequent to the initial start-up time interval wherein during normal operation the charged supply capacitor is directly coupled to the gate of the power switch.

According to an aspect, an electronic circuit (also referred to herein as a start-up circuit) configured to charge a supply voltage capacitor is described. The supply voltage capacitor may be used for providing a supply voltage Vcc (e.g. of 12V or less) to a gate of a source-controlled power switch. The source-controlled power switch may be coupled to the supply voltage capacitor which is configured to supply the substantially constant supply voltage Vcc to the gate of the power switch. The source of the power switch may be used to control an operational mode of the power switch. By way of example, a pulse width modulated (PWM) control signal at the source of the power switch may be used to operate the power switch in a first mode (also referred to as an on/off mode). Alternatively or in addition, a continuous control signal at the source of the power switch may be used to operate the power switch in a second mode (also referred to as a linear mode). The control signal may be generated by a control unit comprised within the electronic circuit.

The power switch may form a switched-mode power converter in conjunction with a power converter network. In particular, the power switch may form the switched-mode power converter when operated in the first (i.e. the on/off) mode.

The power converter network may comprise a flyback network, a buck network and/or a SEPIC (Single-ended primary-inductor converter) network. The power switch may comprise a transistor, e.g. a MOSFET (metal-oxide-semiconductor field-effect transistor), a BJT (bipolar junction transistor) or an IGBT (insulated gate bipolar transistor).

The power switch may be an enhancement-mode power switch (having a positive threshold voltage). Alternatively, the power switch may be a depletion-mode power switch (having a negative threshold voltage). Typically, enhancement-mode power switches are preferable over depletion-mode power switches for high power applications.

A drain and the gate of the power switch may be coupled (e.g. directly coupled) by a pull-up resistor (notably in case of an enhancement-mode power switch). The pull-up resistor may have a relatively high resistance (e.g. in the range of 1MΩ), thereby limiting the current flow via the pull-up resistor (in particular, during normal operation subsequent to a start-up time interval, thereby reducing power losses). The drain of the power switch may be coupled to a mains voltage, e.g. via the power converter network and/or via a rectifier unit. By way of example, the drain of the power switch may be coupled to the mains voltage via an inductance of the power converter network. The voltage at the drain of the power switch may be a rectified mains voltage (having been rectified using e.g. a half wave or a full wave rectifier unit). The mains voltage may be e.g. a mains voltage at 230V (AC 50 Hz) or a mains voltage at 110V (AC 60 Hz).

The start-up circuit may comprise a gate interface and/or a source interface (e.g. respective pins) which may be used for coupling the circuit to the gate and the source of the power switch, respectively. Furthermore, the circuit may comprise a capacitor interface (e.g. a pin) which may be used for coupling the circuit to the supply voltage capacitor.

The start-up circuit may comprise a start-up path arranged to couple the gate interface to the capacitor interface. The start-up path may be configured to apply a voltage at the gate interface, wherein the voltage at the gate interface is at or above a threshold voltage of the power switch. In particular, the start-up path may be configured to form a voltage divider with the pull-up resistor (notably in case of an enhancement-mode power switch). The voltage divider may be configured such that a voltage at the gate interface is at or above a threshold (gate-source) voltage of the power switch, when a voltage derived from the mains voltage is applied to the drain of the power switch. For this purpose, the start-up path may comprise a Zener diode with a pre-determined breakdown voltage. The pre-determined breakdown voltage may be equal to or greater than the threshold voltage of the power switch. As such, it may be ensured that the voltage drop at the gate of the power switch is sufficiently high to start-up the power switch (i.e. to put the power switch in on-state), upon application of a voltage derived from the mains voltage to the drain of the power switch, while at the same time limiting the voltage drop at the gate of the power switch (thereby protecting the power switch).

Furthermore, the start-up circuit may comprise a charging path arranged to couple the source interface to the capacitor interface. The charging path may be configured to provide a charging current to the capacitor interface, when the power switch is in on-state. The charging path may comprise a charging resistor, wherein a resistance of the charging resistor may be such that the supply voltage capacitor is charged in a pre-determined start-up time interval. In other words, the resistance of the charging resistor may depend on the mains voltage (e.g. 230V), on the capacitance (e.g. 1 μF to 100 μF) of the supply voltage capacitor and/or on the pre-determined start-up time interval (e.g. 10 ms to 50 ms).

The start-up path may comprise a first bypass switch arranged to bypass the Zener diode, when the first bypass switch is in on-state. In particular, the first bypass switch may provide a short circuit between the gate interface and the capacitor interface, thereby directly coupling the supply voltage capacitor to the gate of the power switch. In a similar manner, the charging path may comprise a second bypass switch arranged to bypass the charging resistor, when the second bypass switch is in on-state. Alternatively, the second bypass switch may be arranged to enable and/or disable the charging path. Furthermore, the charging path may comprise a charging diode arranged in series to the charging resistor and configured to block a current flowing from the capacitor interface to the source interface. The second bypass switch may be arranged in series to the charging diode. The second bypass switch may only bypass the charging resistor and not the charging diode.

The charging diode may be used to prevent a current flow from the capacitor interface to the source interface, thereby preventing a discharging of the supply voltage capacitor. Furthermore, the charging diode may be used during normal operation (subsequent to the start-up time interval) for spike protection.

The start-up circuit may further comprise a control unit. The control unit may be configured to control the operational mode (e.g. the first and/or second mode) of the power switch. Alternatively or in addition, the control unit may be configured to control the first and/or second bypass switches. In particular, the control unit may be configured to maintain the first and second bypass switches in an off-state during a pre-determined start-up time interval. In cases where the second bypass switch is configured to enable/disable the charging path, the control unit may be configured to maintain the second bypass switch in an on-state during the predetermined start-up time interval (thereby enabling the charging path). By doing this, it can be ensured that upon start-up, a gate voltage is applied to the gate of the power switch (using the start-up path), thereby putting the power switch into the on-state. Furthermore, it can be ensured that the supply voltage capacitor is charged in a controlled manner (using the charging path). As a consequence, the single power switch (which is also part of the power converter) can be used to provide the initial charge to the supply voltage capacitor.

Furthermore, the control unit may be configured to maintain the first and/or second bypass switches in an on-state, subsequent to the pre-determined start-up time interval. In other words, the control unit may be configured to bypass the Zener diode and/or the charging resistor subsequent to the initial start-up time interval. Typically, the start-up circuit is only used for an initial start-up of the power switch (and its supply voltage Vcc). Subsequent to start-up, the start-up path and/or the charging path may be de-activated by putting the first and/or second bypass switches in on-state, thereby deactivating the start-up circuit. As a result, during normal operation subsequent to the start-up time interval, the (charged) supply voltage capacitor may be directly coupled to the gate of the power switch (due to the first bypass switch) and/or possible losses which may be incurred by current flowing through the charging resistor may be avoided (due to the second bypass switch). In cases where the second bypass switch is configured to enable/disable the charging path, the control unit may be configured to maintain the second bypass switch in an off-state subsequent to the predetermined start-up time interval (thereby disabling the charging path and thereby reducing the losses incurred by the charging resistor).

Typically, a power converter or a driver circuit (e.g. of an SSL device) comprising a power converter comprises a DC-to-DC converter which is configured to recharge the supply voltage capacitor subsequent to the start-up time interval. As such, it may be ensured that the supply voltage Vcc to the gate of the power switch is provided during normal operation (subsequent to the start-up time interval) in a power efficient manner.

The control unit of the electronic circuit may further be configured to operate the power switch in the on/off mode (i.e. the first mode) at a commutation cycle rate and/or at a duty cycle, thereby forming the switched-mode power converter in conjunction with the power converter network. By selecting an appropriate commutation cycle rate and/or an appropriate duty cycle, a conversion ratio of the power converter may be set. As indicated above, the power switch may be a power transistor. In such cases, the control unit may be configured to operate the power switch in the linear mode (i.e. the second mode), such that the power switch is traversed by a controlled current, thereby providing a controlled load to the mains voltage. As will be outlined in the present document, the controlled load to the mains voltage may be used to ensure a reliable detection of a phase-cut angle within the mains voltage (e.g. caused by a phase-cut dimmer). As such, the power switch may be used for phase-cut angle detection purposes. The control unit may comprise one or more control switches which are configured to generate a control signal to operate the power switch in the first and/or second mode. In particular, the one or more control switches may be configured to generate a pulse width modulated control signal to operate the power switch in the on/off mode.

Overall, the electronic circuit may be configured to operate the single power switch in three different modes. In particular, the power switch may be operated in the start-up mode, thereby enabling the initial charging of the supply voltage capacitor via the power switch. Furthermore, the power switch may be operated in the first (on/off) mode (thereby operating the power switch as a power converter), and/or the power switch may be operated in the second mode (thereby operating the power switch as a controlled loop for phase-cut angle detection purposes).

According to a further aspect, the use of the electronic circuit described in the present document for charging a supply voltage capacitor is described. As outlined in the present document, the supply voltage capacitor may be used for providing a supply voltage to the gate of the source-controlled power switch. The source-controlled power switch may form a switched-mode power converter in conjunction with a power converter network.

According to another aspect, a circuit arrangement is described. The circuit arrangement may e.g. be a driver circuit such as a driver circuit for an SSL device.

The circuit arrangement may comprise a source-controlled power switch and a power converter network. The power switch may form a switched-mode power converter in conjunction with the power converter network. Furthermore, the circuit arrangement may comprise a supply voltage capacitor, wherein the supply voltage capacitor may be used for providing a supply voltage to a gate of the power switch. In addition, the circuit arrangement may comprise a pull-up resistor coupling the drain and the gate of the power switch. The drain of the power switch may be coupled to the mains voltage. In other words, the drain voltage of the power switch may be a voltage derived from the mains voltage.

In addition, the circuit arrangement may comprise the electronic circuit (i.e. the start-up circuit) described in the present document. The electronic circuit may be configured to charge the supply voltage capacitor upon start-up of the circuit arrangement. Furthermore, the electronic circuit may be configured to de-activate its start-up path and/or to reduce the losses of its charging path during normal operation of the circuit operation, subsequent to the start-up time interval.

The power switch of the circuit arrangement may be configured to act as a level shift, thereby shielding the electronic circuit from the mains voltage. As a consequence, the components of the electronic circuit may not be required to sustain relatively high voltages such as the main voltage. As such, the electronic circuit may be an integrated circuit using e.g. CMOS technology.

It should be noted that the methods and systems including its preferred embodiments as outlined in the present document may be used stand-alone or in combination with the other methods and systems disclosed in this document. The features described for systems are also applicable to corresponding methods and vice versa. Furthermore, all aspects of the methods and systems outlined in the present document may be arbitrarily combined. In particular, the features of the claims may be combined with one another in an arbitrary manner.

SHORT DESCRIPTION OF THE FIGURES

Figure 2A:
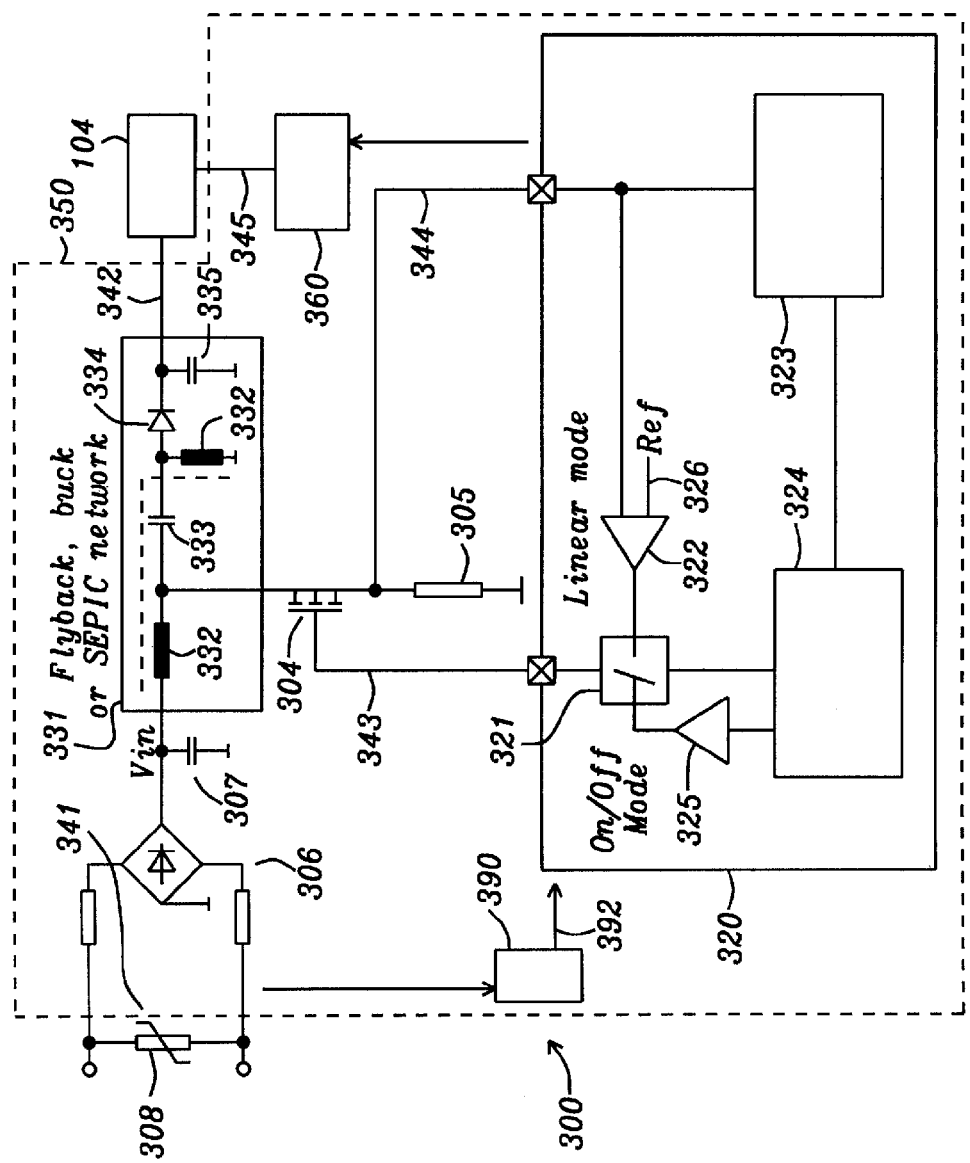
Figure 2B:
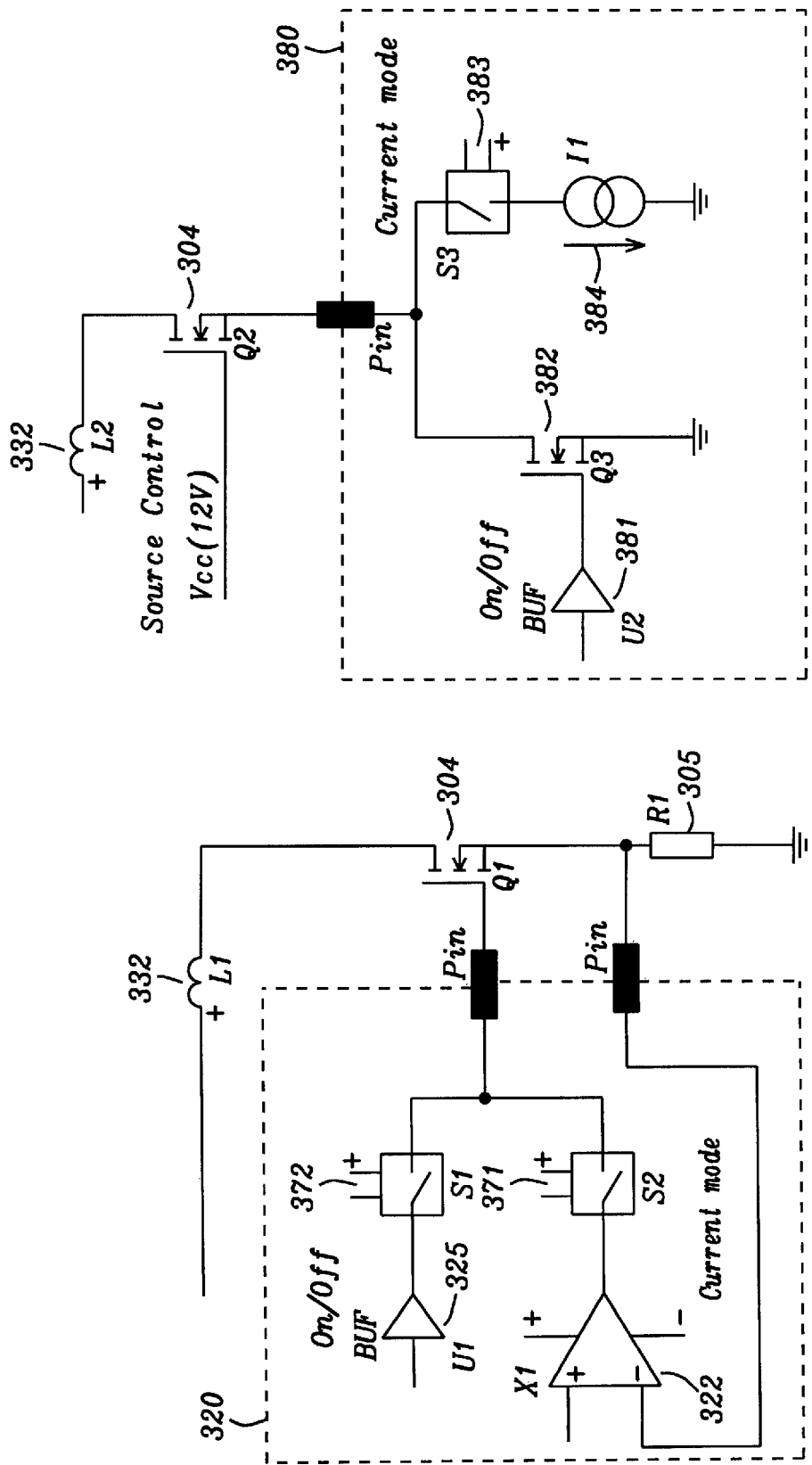
Figure 3A:
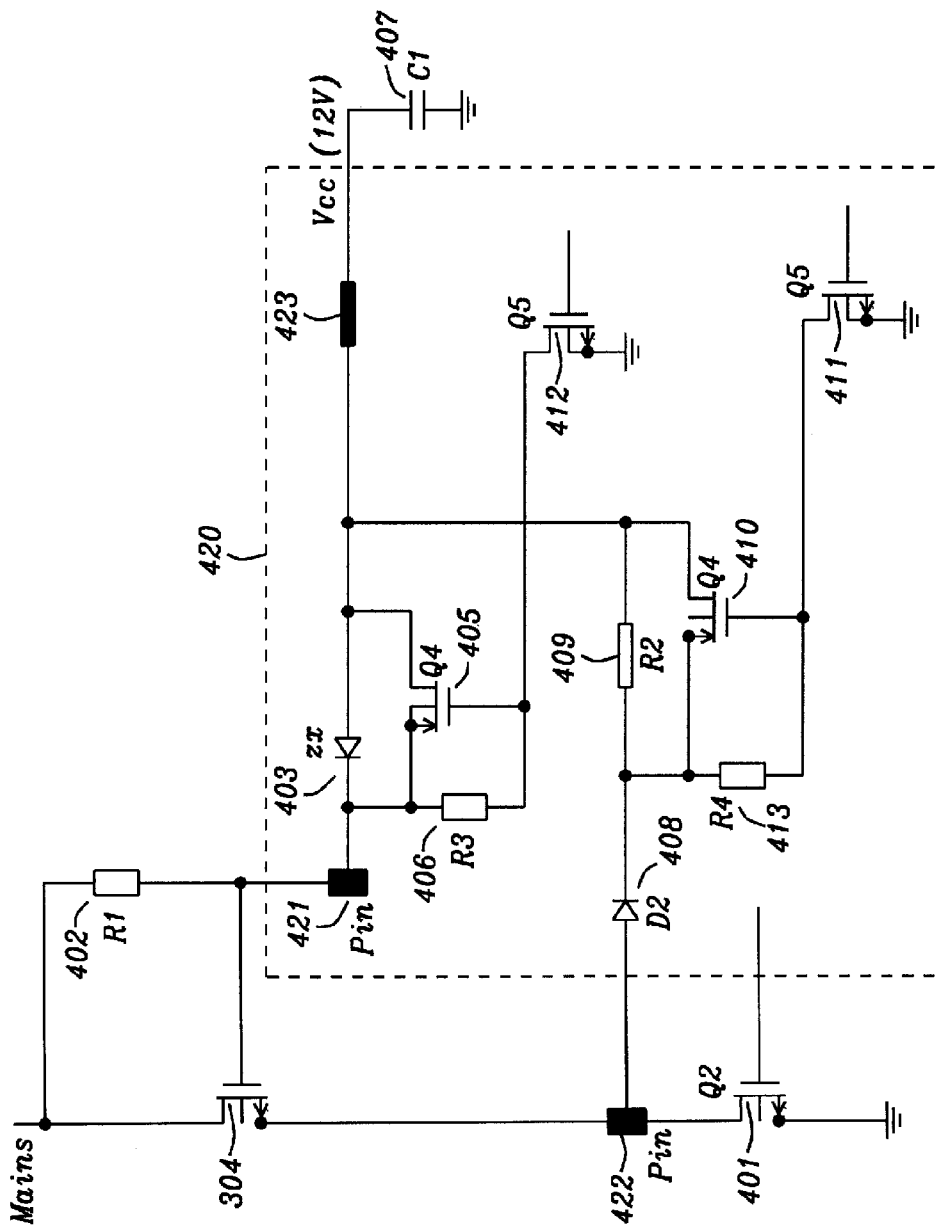
Figure 3B:
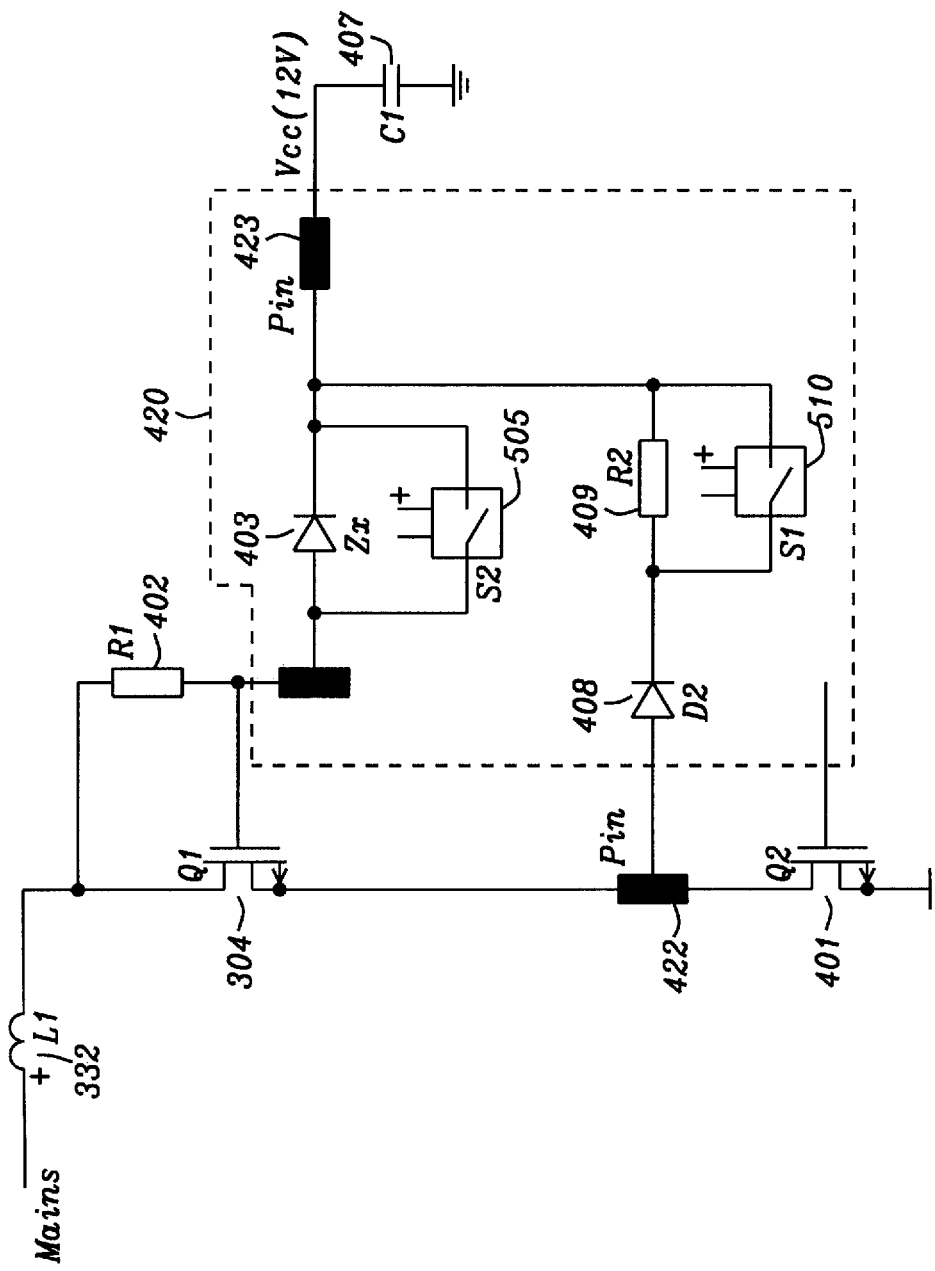
Figure 4:
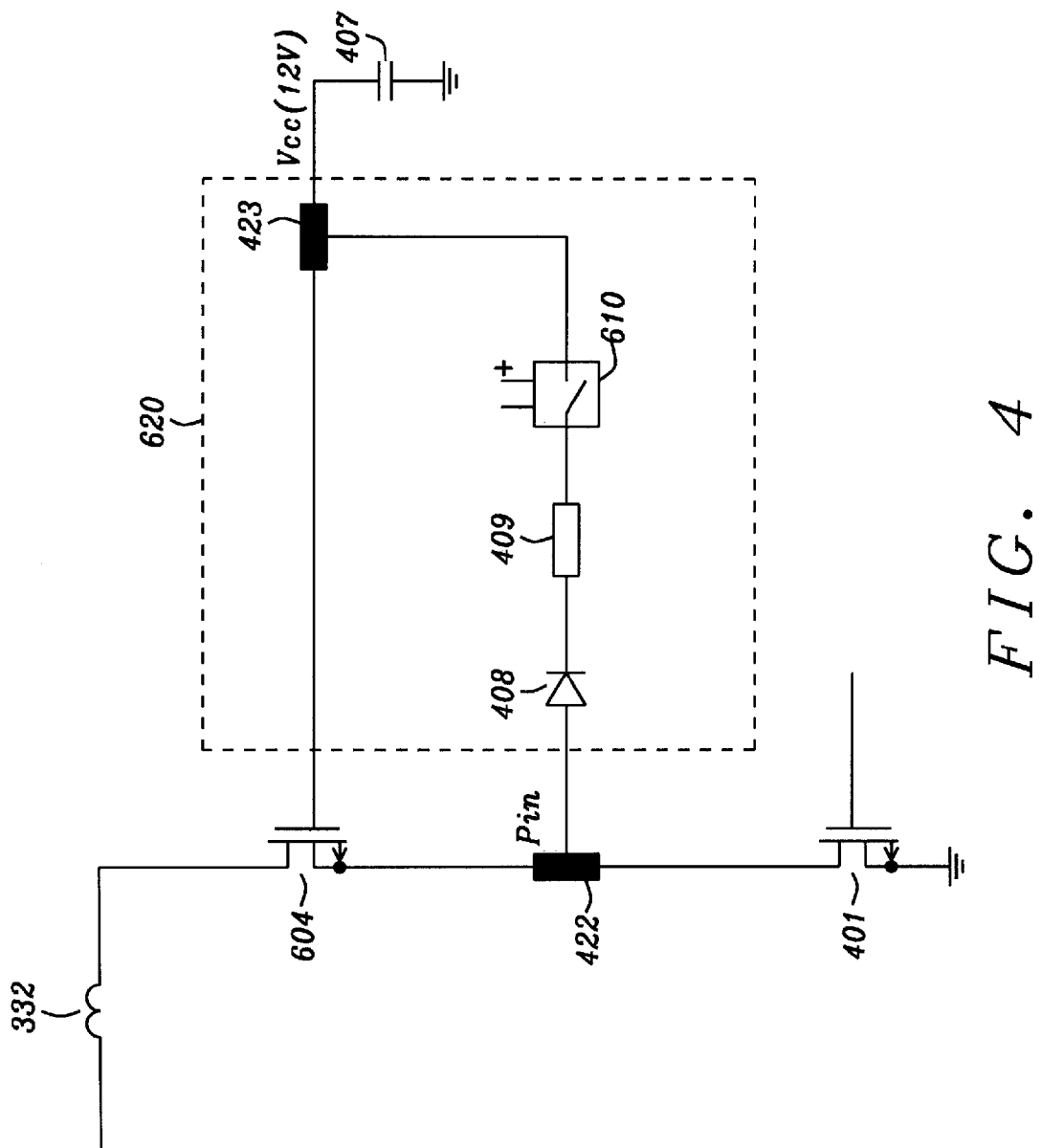
Figure 5:
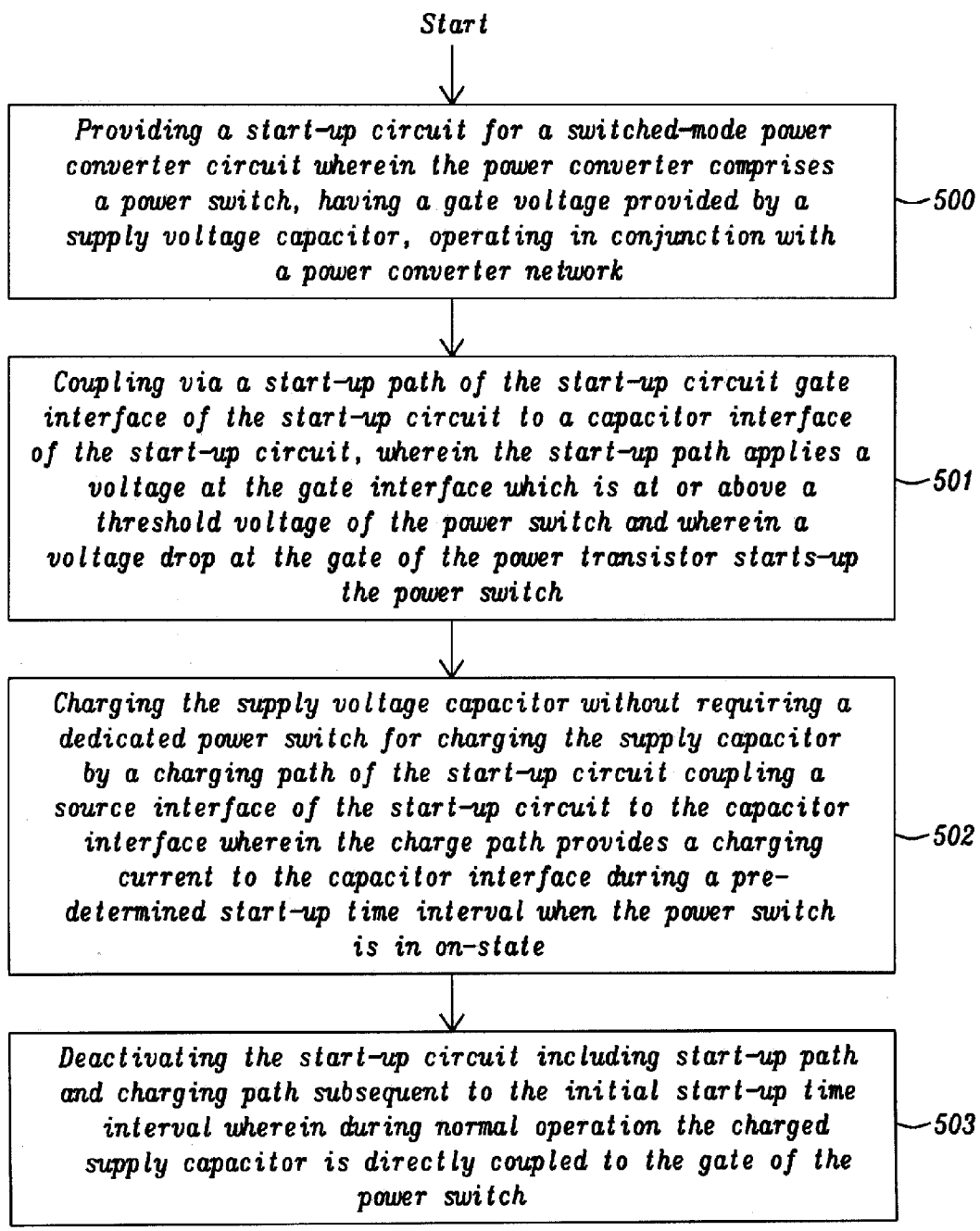

The invention is explained below in an exemplary manner with reference to the accompanying drawings, wherein FIG. 1 illustrates a block diagram of an example light bulb assembly;

FIG. 2*a* shows a block diagram of an example driver circuit for an SSL lamp;

FIG. 2*b* shows block diagrams of example control units of a driver circuit for an SSL lamp;

FIG. 3*a* shows a block diagram of an example circuit for the initial charging of a supply voltage capacitor;

FIG. 3*b* shows another block diagram of an example circuit for the initial charging of a supply voltage capacitor;

FIG. 4 shows a block diagram of an example circuit for the initial charging of a supply voltage capacitor when using a depletion-type power switch; and FIG. 5 shows a flowchart of a method to achieve an electronic start-up circuit charging a supply voltage capacitor

DETAILED DESCRIPTION

As indicated in the introductory section, the present document is directed at an electronic circuit for generating a supply voltage from a mains supply with low start-up times in a cost efficient manner. The electronic circuit will be described in the context of a driver circuit for an SSL device, as the electronic circuit is particularly beneficial, when used in such driver circuits. Nevertheless, it should be noted that the electronic circuit may also be used for generating the supply voltage for a power switch which is used in other contexts (e.g. in the context of a charger for an electronic device or more generally in the context of a switched mode power converter).

Typically, in Europe electricity is supplied at 230-240 VAC, at 50 Hz and in North America at 110-120 VAC at 60 Hz. The present document refers to a mains supply in general, and the principles set out in the present document apply to any suitable electricity supply, including the mains/power line mentioned, and a DC power supply, and a rectified AC power supply. In some applications a DC power supply may be the input to the driver circuit. By way of example, this may be the case when there is a battery back-up (DC power supply) to the mains voltage.

FIG. 1 is a schematic view of a light bulb assembly. The assembly 1 comprises a bulb housing 2 and an electrical connection module 4. The electrical connection module 4 can be of a screw type or of a bayonet type, or of any other suitable connection to a light bulb socket. Typical examples for an electrical connection module 4 are the E11, E14 and E27 screw types of Europe and the E12, E17 and E26 screw types of North America. Furthermore, a light source 6 (also referred to as an illuminant) is provided within the housing 2. Examples for such light sources 6 are a solid state light source 6, such as a light emitting diode (LED) or an organic light emitting diode (OLED) (the latter technology is referred to as solid state lighting, SSL). The light source 6 may be provided by a single light emitting device, or by a plurality of LEDs. In the present document, SSL devices are used as examples for the light source 6.

Driver circuit 8 is located within the bulb housing 2, and serves to convert supply electricity received through the electrical connection module 4 into a controlled drive current for the light source 6. In the case of a solid state light source 6, the driver circuit 8 is configured to provide a controlled direct drive current to the light source 6.

The illumination level of conventional (incandescent) light bulb assemblies may be controlled using so-called phase-cut dimmers which are configured to cut a leading edge and/or a tailing edge of the mains supply. When used for controlling the illumination level of SSL based light bulb assemblies 1, the phase-cut dimmers typically do not operate properly, leading to artefacts such as flicker, multi-firing, etc.

FIG. 2a illustrates an example system 300 for controlling the illumination level of an SSL device 104 e.g. using a dimmer controlled input voltage 341. The example system 300 may comprise the driver circuit 8 (e.g. the driver circuit 350) and the light source 6 (e.g. the SSL device 104) of FIG. 1. An input voltage 341 to the system 300 is provided by a mains voltage power supply 308 (e.g. submitted to a dimmer). A driver circuit 350 is used to generate a drive voltage 342 and a drive current 345. The drive voltage 342 is typically a substantially constant voltage corresponding to the on-voltage of the SSL device 104. The drive current 345 is typically a substantially constant current set in accordance to an intended illumination level of the SSL device 104.

The driver circuit 350 may comprise a rectifier unit 306 configured to provide a rectified version of the input voltage 341. The rectifier unit 306 may comprise a half-wave or a full-wave rectifier. Furthermore, the rectifier unit 306 may comprise EMI (electromagnetic interference) filter components. Typically, the rectifier unit 306 is used in conjunction with a stabilizing capacitor 307 which is used to smooth the rectified input voltage.

Furthermore, the driver circuit 350 typically comprises a power converter network 331. In the illustrated example, the power converter network 331 is a SEPIC (Single-Ended Primary-Inductor Converter) network comprising the coils 332, the capacitors 333, 335 and the diode/switch 334. The power converter network 331 may implement—in combination with the switch 304—a switched-mode power converter configured to transfer energy from the input voltage 341 to the load 104. In particular, the power converter 331, 304 may be operated such that the rectified input voltage is converted into a substantially constant drive voltage 342 for the SSL device 104.

The switch 304 (e.g. a transistor, in particular a power transistor) may be operated in a first mode (also referred to as the on/off mode) where the switch 304 is alternated between its on-state and its off-state at a predetermined commutation cycle rate and at a predetermined duty cycle (wherein the duty cycle defines the fraction of the on-state within a commutation cycle). The commutation cycle rate and the duty cycle may be used to control the conversion ratio of the power converter 331, 304. Furthermore, the switch 304 may be operated in a second mode (also referred to as the linear mode) where the switch 304 is controlled to allow for a predetermined drain-source current through the switch 304. The current through the switch 304 may be used to reset the (rectified) input voltage 341.

In particular, the current through the switch 304 may be, used to discharge the stabilizing capacitor 307, thereby enabling access to the "unsmoothend" (rectified) input voltage 341 and thereby enabling a reliable measurement of the phase-cut angle. In addition, the controlled current through the switch 304 represents a controlled load to the mains voltage 308, thereby ensuring the functioning of a phase-cut dimmer. As such, the switch 304 may be used to reliably detect the phase-cut angle of the input voltage 341 set by a phase-cut dimmer.

The first and second mode of the switch 304 may be controlled via the gate control signal 343 generated by a control unit 320. The control unit 320 may comprise a mode selector 321 which is configured to switch between a first control signal generation unit 325 configured to generated the gate control signal 343 for the first mode of the switch 304 and a second control signal generation unit 322 configured to generate the gate control signal 343 for the second mode of the switch 304. A control logic 324 may be used to control the mode selector 321 based on the feedback signal 344, wherein the feedback signal 344 may be indicative of the current through the switch 304. By way of example, the current through the switch 304 may be sensed by a sensing resistor 305, thereby providing a voltage drop at the sensing resistor 305 which is proportional to the current through the switch 304. In the illustrated example, the feedback signal 344 corresponds to the voltage drop across the sensing resistor 305 and is therefore proportional to the current through the switch 304.

In order to operate the switch 304 in the first mode, the control logic 324 sets the mode selector 321 such that the gate of the switch 304 is coupled to the first control signal generation unit 325 which comprises e.g. an operational amplifier. Furthermore, the control logic 324 may be configured to provide a pulse width modulated signal which is converted by the first control signal generation unit 325 into a gate control signal 343 which puts the switch 304 into alternating on/off states at the pre-determined commutation cycle rate and at the pre-determined duty cycle.

In order to operate the switch 304 in the second mode, the control logic 324 sets the mode selector 321 such that the gate of the switch 304 is coupled to the second control signal generation unit 322 which comprises e.g. a comparator. The comparator may be used to implement a feedback loop using the feedback signal 344, thereby determining the gate control signal 343 such that the feedback signal 344 corresponds to a pre-determined reference signal 326. In particular, the gate control signal 343 may be determined such that the current through the switch 304 corresponds to a pre-determined discharge current. The pre-determined discharge current may be selected such that the components of the driver circuit 350 (notably of the power converter network 331 and of the rectifier 306) are protected from overstress and/or that the discharging is performed within a predetermined discharge time interval. Furthermore, the pre-determined discharge current may be set in accordance to a desired load to the mains voltage 308, in order to ensure a reliable detection of the phase-cut angle of the input voltage 341. Typically, the pre-determined discharge current will be determined based on a compromise between overstress protection and discharge time interval. Alternatively or in addition, the pre-determined discharge current may be determined based on power loss considerations. By way of example, the predetermined discharge current may be in the range of 10 mA or 100 mA or 200 mA. The control unit 320 may further comprise a feedback processing module 323 configured to analyze the feedback signal 344.

The control logic 324 may determine a phase-cut time interval indicative of the phase-cut angle. The phase-cut time interval may correspond to the time interval between the time instant when the switch 304 was put into the second mode and the time instant when it is detected that the input voltage 341 exceeds a predetermined threshold (i.e. when it is detected that the phase-cut dimmer switched on). In other words, if it is detected that the dimmer switches on, the control logic 324 may control the mode selector 321 to put the switch 304 into the first mode.

Furthermore, the driver circuit 350 of FIG. 2*a* may comprise input voltage measurement means 390 (e.g. a voltage divider). The input voltage measurement means 390 may be configured to provide a voltage 392 derived from the input voltage 341 to the control unit 320. The control unit 320 may comprise a pin to receive the voltage 392. The control unit 320 may be configured to operate the switch 304 in the first mode when the (absolute) input voltage 341 is above a predetermined input voltage threshold. Furthermore, the control unit 320 may be configured to operate the switch 304 in the second mode when the (absolute) input voltage 341 is below the pre-determined input voltage threshold (indicating a phase-cut angle of the input voltage 341). The pre-determined input voltage threshold may e.g. be in the range of 20V.

As such, a single power switch 304 may be operated in at least two different modes, thereby providing two different functions. In particular, the single power switch 304 may be operated in the first (on/off) mode, thereby providing a switched-mode power converter in conjunction with the power converter network 331. Furthermore, the single power switch 304 may be operated in the second (linear) mode as a controlled current source, thereby providing a controlled load to the mains voltage power supply 308 and thereby enabling the reliable detection of the phase-cut angle of the input voltage 341.

FIG. 2*b* illustrates block diagrams of example control units 320, 380 for a driver circuit 300. The control unit 320 of FIG. 3*b* corresponds to the control unit 320 shown in FIG. 3*b*. Furthermore, the control unit 320 of FIG. 3*b* comprises a switch 372 configured to provide the pulse width modulated gate control signal 343 to the switch 304, for operating the switch 304 in the on/off mode. In addition, the control unit 320 of FIG. 3*b* comprises a transistor 371 configured to control the gate control signal 343 of the switch 304, thereby controlling the current through the switch 304.

FIG. 2*b* (right hand side) shows a block diagram of an example control unit 380 which may be used in conjunction with a source-controlled switch 304. In this case, the switch 304 may have the function of a level shifter which is controlled via its source. The switch 304 of FIG. 3*b* (right hand side) is coupled to a supply voltage Vcc (e.g. Vcc=12V). The control unit 380 comprises a first branch comprising a PWM driver 381 and a PWM control switch 382 operated in an on/off mode. Furthermore, the control unit 380 comprises a second branch comprising a switch 383 and a current source 384. The first branch may be used to operate the power switch 304 in the first mode (i.e. in the on/off mode). The second branch may be used to operate the power switch 304 in the second mode (i.e. in the linear mode). The current through the power switch 304 may be fixed using the current source 384. When operated in the second mode, the switch 382 of the first branch may be kept in an off state. On the other hand, when operated in the first mode, the switch 383 may be kept in an off state. The control unit 380 may be advantageous as it does not comprise a control loop, and/or as it makes use of a reduced number of pins.

As such, a single power switch 304 may be operated in at least two different modes, thereby providing two different functions of a driver circuit 350. As outlined above, the supply voltage Vcc for the power switch 304 should be generated from the mains voltage power supply 308. Upon start-up of a driver circuit 350 (e.g. when turning on a light bulb assembly 1 comprising the driver circuit 350), the supply voltage Vcc should be provided within a short start-up time interval (e.g. to ensure that the light bulb assembly 1 emits light within a short time interval after having turned-on the assembly 1). This may be achieved using e.g. an additional external power switch which couples the mains supply 308 (and/or the input voltage 341) to a supply voltage capacitor in order to charge the supply voltage capacitor which provides the supply voltage Vcc. This, however, is disadvantageous, as the use of an additional external power switch is typically costly.

FIG. 3*a* shows the block diagram of an electronic circuit 420 which allows for a short start-up time for providing a stable supply voltage Vcc. The electronic circuit 420 of FIG. 3*a* is configured to charge the supply voltage capacitor 407 within a relatively short start-up time interval, without the need for an additional external power switch. The electronic circuit 402 of FIG. 3*a* makes use of the power switch 304 which may already be used to provide a switch-mode power converter (when operated in the first mode).

FIG. 3*a* shows the switch 304 which is operated in a source-controlled manner (similar to FIG. 2*b*, right hand side). Furthermore, FIG. 3a shows a control switch 401 which may be used to operate the switch 304 in one or more of a plurality of modes. By way of example, the control switch 401 may be used to generate a pulse width modulated (PWM) source signal, thereby operating the power switch 304 in the first (i.e. on/off) mode. Alternatively or in addition, the control switch 401 may be operated as a controlled current source, thereby operating the power switch 304 in the second (i.e. linear) mode. As such, the control switch 401 may have the function of (or may be comprised within) the control unit 320, 380 of FIG. 2b.

The electronic circuit 420 of FIG. 3a may be used within a start-up phase of the driver circuit 350 to generate the supply voltage Vcc for the power switch 304 using a supply voltage capacitor 407. The supply voltage capacitor 407 may have a capacitance e.g. in the range of 1 to 10 or 100 µF. As outlined above, the power switch 304 may be coupled to the mains voltage power supply 308, e.g. via the power converter network 331 and/or via the rectifier unit 306. Upon start-up, the power switch 304 may be (by default) in its off-state. This may be due to the fact that the gate-source voltage of the power switch 304 does not exceed a threshold voltage VT of the power switch 304 upon start-up.

The electronic circuit 420 may comprise a gate interface 421 (e.g. a pin) configured to couple the electronic circuit 420 to the gate of the power switch 304. Furthermore, the electronic circuit 420 may comprise a capacitor interface 423, (e.g. a pin) configured to couple the electronic circuit 420 to the supply voltage capacitor 407. In addition, the electronic circuit 420 may comprise a source interface 422 (e.g. a pin) configured to couple the electronic circuit 420 to the source of the power switch 304.

The electronic circuit 420 comprises a Zener diode 403 which is arranged such that it operates in a reverse-biased mode with respect to a rectified mains voltage (and/or a rectified input voltage 341). The Zener diode 403 of FIG. 3a is arranged in series to the supply voltage capacitor 407. Furthermore, the Zener diode 403 may be arranged in series with a pull-up resistor 402 (which may have a relatively high resistance in the range of e.g. 1MΩ). The pull-up resistor 402 is typically configured to sustain high voltages (in the range of the mains voltage). During start-up, the pull-up resistor 402, the (reverse-biased) Zener diode 403 and the supply voltage capacitor 407 may be arranged in series to the (rectified) mains voltage (and/or a rectified input voltage 341). Furthermore, the pull-up resistor 402 may be arranged between the gate and the drain of the power switch 304. In addition, the Zener diode 403 may be arranged between the gate of the power switch 304 and the supply voltage capacitor 407. In particular, the pull-up resistor 402 and the Zener diode may form a voltage divider of the (rectified) mains voltage (or a voltage derived thereof) with a midpoint of the voltage divider being coupled (directly) to the gate of the power switch 304.

The Zener diode 403 may have a breakdown voltage (also referred to as a Zener voltage). The breakdown voltage may be adapted to the threshold voltage VT of the power switch 304. By way of example, the breakdown voltage may exceed the threshold voltage VT. In an embodiment, the breakdown voltage of the Zener diode 403 is in the range of 5V, wherein the threshold voltage VT is in the range of 1V. Upon start-up, i.e. when applying the mains voltage 308 (or a voltage derived thereof) to the driver circuit 350 comprising the electronic circuit 420, the Zener diode 403 ensures an (almost) immediate voltage drop at the gate of the power switch 304, wherein the immediate voltage drop is limited to (and typically corresponds to) the breakdown voltage of the Zener diode 403. By selecting the breakdown voltage of the Zener diode 403 based on the threshold voltage VT of the power switch 304 (e.g. greater than VT), it can be ensured that the power switch 304 can (almost) immediately be switched to its on-state, even though the supply voltage capacitor 407 has not yet been charged. As such, the power switch 304 may be used to charge the supply voltage capacitor 407.

As the Zener diode 403 is operated at or above its breakdown voltage, a charging current may flow through the pull-up resistor 402 and the (reverse-biased but broken down) Zener diode 403, and thereby charge the supply voltage capacitor 407. The resistance of the pull-up resistor 402 is typically selected to be relatively high (e.g. in the range of 1MΩ), in order to limit the current through the pull-up resistor 402, thereby limiting the losses incurred during subsequent (normal) operation of the driver circuit 350 and the electronic circuit 420.

A first bypass switch 405 (shown in conjunction with an example gate-source resistor 406) may be arranged in parallel to the Zener diode 403. The first bypass switch 405 may be configured to bypass the Zener diode 403, when the first bypass switch 405 is in an on-state. In particular, the first bypass switch 405 may be configured to couple the pull-up resistor 402 with the voltage supply capacitor 407, while bypassing the Zener diode 403, when the first bypass switch 405 is in an on-state. The first bypass switch 405 may be in off-state upon start-up of the electronic circuit 420 (thereby allowing the Zener diode 403 to provide the breakdown voltage). The first bypass switch 405 may be switched to its on-state (using the control switch 412) subsequent to start-up. By way of example, the first bypass switch 405 may be switched to its on-state after a pre-determined charging time interval (thereby ensuring that the supply voltage capacitor has been sufficiently charged to provide the supply voltage Vcc), and/or the first bypass switch 405 may be switched to its on-state when the voltage drop across the supply voltage capacitor 407 exceeds a pre-determined voltage threshold (e.g. a pre-determined fraction of the supply voltage Vcc). The first bypass switch 405 is typically maintained in its on-state subsequent to start-up, thereby ensuring that the supply voltage Vcc from the supply voltage capacitor 407 is provided directly to the gate of the power switch 304.

The pull-up resistor 402 typically forms an RC circuit in conjunction with a gate capacitance of the power switch 304, which is in the range of 1 nF. This means that after a time interval given by the product of the gate capacitance and the resistance of the pull-up resistor 402 (e.g. 1MΩ*1 nF—a time interval of approx. 1 ms), the power switch 304 switches to its on-state, in response to the application of the breakdown voltage of the Zener diode 403 to the gate of the power switch 304.

The electronic circuit 420 further comprises a charging resistor 409 which may be arranged in series to a charging switch 408 (e.g. a charging diode). The charging resistor 409 and the charging switch 408 may form a charging path. The charging path may couple the source of the power switch 304 to the supply voltage capacitor 407. Furthermore, the charging path may be coupled to the gate of the power switch 304 (e.g. via the Zener diode 403).

When the power switch 304 goes to its on-state (subsequent to the application of the breakdown voltage to the gate of the power switch 304), a drain-source current flows through the power switch 304 and through the charging path to the supply voltage capacitor 407. As such, the supply voltage capacitor 407 is charged via the power switch 304. The charging time may be adjusted by adjusting the resistance of the charging resistor 409. Typically, the voltage drop across the charging resistor 409 is given by the difference between the breakdown voltage of the Zener diode 403 and the threshold voltage VT of the power switch 304 (and possibly the voltage drop across the charging switch 408). In case of a breakdown voltage of 5V and a threshold voltage VT of 1V, the voltage drop across the charging resistor 409 is around 4V. By way of example, the resistance of the charging resistor 409 may be selected to allow for a charging of the supply voltage capacitor 407, i.e. of a start-up time interval, in the range of 10-50 ms. In case of a supply voltage capacitor 407 of 100 µF, the start-up charging resistor 409 may be at approx. 100Ω.

In a similar manner to the first bypass switch 405, a second bypass switch 410 (shown in conjunction with a gate-source resistor 413) may be arranged in parallel to the charging resistor 409, thereby allowing to bypass the charging resistor 409 subsequent to the initial charging of the supply voltage capacitor 407. The second bypass switch 410 may be controlled by a respective control switch 411. In a similar manner to the first bypass switch 405, the second bypass switch 410 may be in off-state upon start-up of the electronic circuit 420 and the driver circuit 350 (thereby allowing the start-up charging resistor 409 to control the charging current). The second bypass switch 410 may be switched to its on-state subsequent to start-up (i.e. subsequent to the start-up time interval). By way of example, the second bypass switch 410 may be switched to its on-state after a pre-determined charging time interval (thereby ensuring that the supply voltage capacitor has been sufficiently charged to provide the supply voltage Vcc), and/or the second bypass switch 410 may be switched to its on-state when the voltage drop across the supply voltage capacitor 407 exceeds a pre-determined voltage threshold (e.g. a pre-determined fraction of the supply voltage Vcc). The second bypass switch 410 is typically maintained in its on-state subsequent to start-up, thereby reducing losses of the electronic circuit 420 subsequent to start-up.

Subsequent to start-up, e.g. subsequent to an initial charging of the supply voltage capacitor 407, the first and second bypass switches 405, 410 are switched to ON-state, thereby bypassing the Zener diode 403 and the charging resistor 409, respectively. As indicated above, the start-up time interval may be in the range of 10-50 ms. After start-up, the recharging of the supply voltage capacitor 407 is typically performed in a substantially lossless manner using a dedicated DC-to-DC converter (which is not illustrated in FIG. 3a). By using the electronic circuit 420 of FIG. 3a, the initial charging of the supply voltage capacitor 407 can be achieved with a relatively low start-up time, without the need for an additional power switch. The electronic circuit 420 allows for a re-use of the power switch 304 which is also used within the driver circuit 350 for providing a switched-mode power supply (in conjunction with the power converter network 331).

It should be noted that the electronic circuit 420 does not require any components which need to sustain voltages in the range of the mains voltage. The power switch 304 functions as a level shifter and shields the components of the electronic circuit 420 from the high voltages of the mains voltage. Only the additional pull-up resistor 402 is submitted to the mains voltage.

Subsequent to start-up, i.e. during normal operation of the driver circuit 350, the losses incurred by the electronic circuit 420 may be kept low by the use of the first and second bypass switches 405, 410 which bypass the Zener diode 403 and the charging resistor 409, respectively. Furthermore the pull-up resistor 402 may be selected to be relatively high, thereby limiting the current flow through the pull-up resistor 402 during normal operation (i.e. subsequent to the start-up time interval).

It should be noted that the charging switch 408 may be used during normal operation to protect the power switch 304 from high capacitive voltage spikes. As illustrated in FIG. 3a, the charging switch 408 may be a diode 408 which is reverse-biased during normal operation of the driver circuit 350 (and of the power switch 304). It can be seen that during normal operation, the diode 408 couples the source of the power switch 304 to the gate of the power switch 304, such that the diode 308 is typically reverse-biased by the threshold voltage VT of the power switch 304. Due to capacitive effects between the drain and the source of the power switch 304, the source of the power switch 304 may exhibit voltage spikes which may be clamped via the (then forward-biased) diode 308 to the supply voltage capacitor 407. As such, the diode 408 may act as a spike filter.

FIG. 3b shows a block diagram of another example electronic circuit 420 which is configured to provide an initial charging of the supply voltage capacitor 407. The circuit 420 of FIG. 3b corresponds to the circuit 420 of FIG. 3a. However, the first and second bypass switches 405, 410 (and the respective gate-source resistors 406, 413 and the respective control switches 412, 411) are represented as first and second bypass switches 505, 510 in a functional manner.

Overall, the electronic circuit 420 comprises a start-up path between the gate interface 421 and the capacitor interface 423, which is configured to put the power switch 304 into its on-state, thereby enabling the charging of the supply voltage capacitor via the power switch 304 and via the charging path. In the illustrated example, the start-up path comprises the Zener diode 403 and the first bypass switch 405. The use of a pull-up resistor 402 having a relatively high resistance ensures that during normal operation (subsequent to the start-up time interval) power losses due to a current flow through the pull-up resistor 402 are kept low.

Furthermore, the electronic circuit 402 comprises a charging path between the source interface 422 and the capacitor interface 423 which is configured to charge the supply voltage capacitor 407 using the drain-source current of the power switch 304.

FIGS. 3a and 3b show example circuit diagrams when using power switches 304 with a positive threshold voltage VT (i.e. when using enhancement-mode power switches 304 or transistors). FIG. 4 shows an example circuit diagram of an example electronic circuit 620, when using a depletion-mode power switch 604 having a negative threshold voltage VT. In such cases, the power switch 604 is typically in on-state upon start-up. This is due to the fact that the voltage at the gate of the power switch 604 is typically zero upon start-up, i.e. higher than the negative threshold voltage of the depletion-mode power switch 604. In such cases, the start-up path solely comprises (e.g. consists of) a link between the gate of the power switch 604 and the capacitor interface 423.

Furthermore, FIG. 4 illustrates a variant of the charging path, which may also be used in conjunction with the circuit diagrams of FIGS. 3a and 3b. In a similar manner, the charging path of FIGS. 3a and 3b may be used in conjunction with a depletion-mode power switch 604. The charging path of FIG. 4 comprises a bypass switch 610 which is configured to enable/disable the charging path. The bypass switch 610 is arranged in series to the charging resistor 409 and/or to the charging diode 408. A control unit of the electronic circuit 620 may be configured to put and/or to maintain the bypass switch 610 in on-state upon start-up and/or within the entire start-up time interval. Furthermore, the control unit of the electronic circuit 620 may be configured to put and/or to maintain the bypass switch 610 in off-state subsequent to the start-up time interval.

It should be noted that enhancement-mode power switches 304 are typically preferable for high power applications, as enhancement-mode power switches 304 can typically sustain higher drain-source currents than depletion-mode power switches 604.

FIG. 5 shows a flowchart of a method to achieve an electronic start-up circuit charging a supply voltage capacitor, wherein the supply voltage capacitor is intended for providing a supply voltage to a gate of a source-controlled power switch; wherein the power switch forms a switched-mode power converter, in conjunction with a power converter network; and wherein the drain of the power switch is coupled to a mains voltage. A first step 500 depicts a provision of a start-up circuit for a switched-mode power converter circuit wherein the power converter comprises a power switch, having a gate voltage provided by a supply voltage capacitor, operating in conjunction with a power converter network. The next step 501 shows coupling via a start-up path of the start-up circuit a gate interface of the start-up circuit to a capacitor interface of the start-up circuit, wherein the start-up path applies a voltage at the gate interface which is at or above a threshold voltage of the power switch and wherein a voltage drop at the gate of the power transistor starts-up the power switch. Step 502 illustrates charging the supply voltage capacitor without requiring a dedicated power switch for charging the supply capacitor by a charging path of the start-up circuit coupling a source interface of the start-up circuit to the capacitor interface wherein the charge path provides a charging current to the capacitor interface during a pre-determined start-up time interval when the power switch is in; wherein the charging path is configured to provide a charging current to the capacitor interface, when the power switch is in on-state. Finally step 503 depicts deactivating the start-up circuit including start-up path and charging path subsequent to the initial start-up time interval wherein during normal operation the charged supply capacitor is directly coupled to the gate of the power switch.

In the present document, an electronic circuit for charging a supply voltage capacitor upon start-up has been described. The electronic circuit may be used e.g. in conjunction with a switched-mode power supply comprising a power switch. The electronic circuit is advantageous in that is allows the re-use of the power switch of the switched-mode power supply, thereby removing the need for an additional power switch dedicated for the charging of the supply voltage capacitor upon start-up. Furthermore, the electronic circuit allows for the implementation of short start-up time intervals.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

The invention claimed is:

1. An electronic circuit configured to charge a supply voltage capacitor, wherein the supply voltage capacitor is intended for providing a supply voltage to a gate of a source-controlled power switch; wherein the power switch forms a switched-mode power converter, in conjunction with a power converter network; and wherein the drain of the power switch is coupled to a mains voltage; wherein the circuit comprises
   a gate interface and a source interface intended for coupling the circuit to the gate and a source of the power switch, respectively;
   a capacitor interface intended for coupling the circuit to the supply voltage capacitor;
   a start-up path arranged to couple the gate interface to the capacitor interface;
   wherein the drain and the gate of the power switch are directly coupled by a pull-up resistor, such that a gate-drain voltage of the power switch corresponds to a voltage drop at the pull-up resistor; wherein the start-up path comprises a Zener diode with a pre-determined breakdown voltage; wherein the pre-determined breakdown voltage is equal to or greater than a threshold voltage of the power switch; wherein during start-up the Zener diode, the pull-up resistor and the supply voltage capacitor are arranged in series with the mains voltage, such that a voltage at the gate interface is at or above the threshold voltage for putting the power switch in on-state, and such that a charging current for charging the supply voltage capacitor flows through the pullup-resistor and the Zener diode; and
   a charging path arranged to couple the source interface to the capacitor interface;
   wherein the charging path is configured to provide a charging current to the capacitor interface via the power switch, when the power switch is in on-state.

2. The circuit of claim 1, wherein the start-up path comprises a first bypass switch arranged to bypass the Zener diode when in on-state.

3. The circuit of claim 2, wherein
   the charging path comprises a charging resistor; and
   a resistance of the charging resistor is such that the supply voltage capacitor is charged in a pre-determined start-up time interval.

4. The circuit of claim 3 wherein the charging path further comprises a charging diode arranged in series to the charging resistor and configured to block a current flowing from the capacitor interface to the source interface.

5. The circuit of claim 3 wherein the charging path comprises a second bypass switch arranged to bypass the charging resistor when in on-state.

6. The circuit of claim 5, further comprising a control unit configured to
   maintain the first and second bypass switches in an off-state during a pre-determined start-up time interval; and/or
   maintain the first and second bypass switches in an on-state, subsequent to the pre-determined start-up time interval.

7. The circuit of claim 6, wherein the control unit is further configured to operate the power switch in an on/off mode at a commutation cycle rate and/or at a duty cycle, thereby forming the switched-mode power converter in conjunction with the power converter network.

8. The circuit of claim 7, wherein
   the power switch is a power transistor; and the control unit is configured to operate the power switch in a linear mode, such that the power switch is traversed by a controlled current, thereby providing a controlled load to the mains voltage.

9. The circuit of claim 7, wherein the control unit comprises a control switch configured to generate a pulse width modulated control signal to operate the power switch in the on/off mode.

10. The circuit of claim 1, further comprising:
the source-controlled power switch; and
the power converter network;
the supply voltage capacitor.

11. The circuit of claim 10, wherein the power converter network comprises a flyback network, a buck network and/or a SEPIC network.

12. The circuit of claim 10, wherein the power switch is configured to act as a level shift, thereby shielding the electronic circuit from the mains voltage.

13. The circuit of claim 10, wherein the source-controlled power switch is an enhancement-mode power switch.

* * * * *